(12) United States Patent
Geng et al.

(10) Patent No.: US 10,749,511 B2
(45) Date of Patent: Aug. 18, 2020

(54) IO CIRCUIT AND ACCESS CONTROL SIGNAL GENERATION CIRCUIT FOR IO CIRCUIT

(71) Applicants: Semiconductor Manufacturing International (Beijing) Corporation, Beijing (CN); Semiconductor Manufacturing International (Shanghai) Corporation, Shanghai (CN)

(72) Inventors: Yan Geng, Shanghai (CN); Jie Chen, Shanghai (CN); Xiao Yuan Ma, Shanghai (CN); Kai Zhu, Shanghai (CN); Yan Ling, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/537,142

(22) Filed: Aug. 9, 2019

(65) Prior Publication Data
US 2020/0228103 A1    Jul. 16, 2020

(30) Foreign Application Priority Data
Jan. 10, 2019 (CN) .......................... 2019 1 0021936

(51) Int. Cl.
*H03K 3/356* (2006.01)
(52) U.S. Cl.
CPC .............................. *H03K 3/356113* (2013.01)

(58) Field of Classification Search
CPC . H03K 3/356113; H03K 3/012; H03K 17/165
See application file for complete search history.

(56) References Cited

U.S. PATENT DOCUMENTS

| 7,477,075 | B2 * | 1/2009 | Kesselring ....... H03K 19/00315 326/82 |
| 9,837,161 | B2 * | 12/2017 | Muller .................. G11C 16/28 |
| 2010/0097117 | A1 * | 4/2010 | Wang ............... H03K 3/356113 327/333 |

* cited by examiner

*Primary Examiner* — Dinh T Le
(74) *Attorney, Agent, or Firm* — Brinks Gilson & Lione

(57) ABSTRACT

The present disclosure provides an IO circuit and an access control signal generation circuit for the IO circuit. In one implementation, the access control signal generation circuit includes: a bias module coupled with an IO port, for generating an access control signal according to an IO port signal and an IO control signal, where a voltage value of the access control signal is a maximum value of a voltage value of an IO port voltage division signal and a voltage value of the IO control signal, and the voltage value of the IO port voltage division signal is a percentage of a voltage value of the IO port signal; an access control module coupled with the bias module, the access control module configured to control cut-off or conduction when receiving the access control signal and the IO port signal and outputting a first interface signal; and a higher-selection module configured to generate a second interface signal according to an IO power source signal and the IO port signal. In the present disclosure, the voltage of the first interface signal varies according to the voltage of an IO port, so as to resolve the problem of reliability, thereby improving the open-drain performance.

20 Claims, 10 Drawing Sheets

IO CIRCUIT AND ACCESS CONTROL SIGNAL GENERATION CIRCUIT FOR IO CIRCUIT

RELATED APPLICATIONS

The present application claims priority to Chinese Patent Appln. No. 201910021936.5, filed Jan. 10, 2019, the entire disclosure of which is hereby incorporated by reference.

BACKGROUND

Technical Field

The present disclosure relates to the technical field of semiconductor manufacturing, and in particular to an IO circuit and an access control signal generation circuit for the IO circuit.

Related Art

In current design of an integrated circuit, an input/output circuit (I/O PAD, Input/Output PAD) is an essential component. The input/output circuit may be used as a buffer circuit, and usually uses a push-pull circuit structure to implement the function of buffering, so that the input/output circuit may be used as an input/output transmitter (I/O transmitter).

With the development of semiconductor technology, an integrated circuit usually has a signal working at the voltage swing lower than that of an external circuit signal. An integrated circuit of low power consumption often requires much lower working voltage. When a chip is connected to a peripheral circuit, an input/output circuit of the chip needs to convert a signal with low voltage swing from the integrated circuit into a signal with high voltage swing which may be recognized by an external circuit if the working voltage of the chip is lower than the working voltage of the peripheral circuit. A circuit for implementing the conversion of the signal with low voltage swing into the signal with the high voltage swing usually includes an open-drain output circuit. The open-drain output circuit is one of the main properties of an IO circuit with the external power source voltage higher than or equal to the IO power source voltage.

In the prior art, when the difference between the external power source voltage and the core voltage is higher than the maximum value of the working voltage of a device, the IO circuit has poor open-drain output property in order to avoid the problem of reliability of the device.

SUMMARY

A problem addressed by the present disclosure is to provide an IO circuit and an access control signal generation circuit for the IO circuit, so as to improve the open-drain performance of the IO circuit.

In order to address the foregoing problem, the present disclosure provides an access control signal generation circuit for an IO circuit. In one implementation, an access control signal generation circuit includes: a bias module coupled with an IO port that is configured to generate an access control signal according to an IO port signal and an IO control signal, where a voltage value of the access control signal is a maximum value of a voltage value of an IO port voltage division signal and a voltage value of the IO control signal. The voltage value of the IO port voltage division signal is a percentage of a voltage value of the IO port signal, where the percentage is greater than 0 and less than 100. The access control signal generation unit may further includes an access control module coupled with the bias module that is configured to control cut-off or conduction according to a relationship between the access control signal and the IO port signal received and outputting a first interface signal, where in an open-drain mode, when the IO control signal is in logic low level, the access control module is conducting and a voltage value of the first interface signal varies according to the voltage value of the IO port signal. The access control signal generation module may further include a higher-selection module configured to generate a second interface signal according to an IO power source signal and the IO port signal, where a voltage value of the second interface signal is the maximum value of a voltage value of the IO power source signal and the voltage value of the IO port signal.

The present disclosure further provides an IO circuit. In one implementation the IO circuit includes: the access control signal generation circuit described above; a logic conversion module configured to receive an input Core signal and an input Core control signal and to output the IO control signal and an internal pull-up control signal; an internal pull-up module coupled with the access control signal generation circuit, the internal pull-up module configured to receive the internal pull-up control signal, the IO power source signal, the IO port signal, the first interface signal, and the second interface signal, and to conduct and pull the IO port up when the input Core signal is in logic high level and being cut off in the open-drain mode; and an external pull-up resistance connected between an external power source and the IO port in series, where the IO port is pulled up through the external pull-up resistance in the open-drain mode.

Compared with the prior art, technical solutions provided by the present disclosure have the following advantages:

In the open-drain mode, in the bias module, the voltage value of the IO port voltage division signal is $V_b$, the voltage value of the IO port signal is $V_{PAD}$, and $V_b$=a percentage of $V_{pad}$. When the IO circuit is in the open-drain mode and the IO control signal is in logic low level, the access control module is conducting and the voltage of the first interface signal varies according to the voltage value VPAD of the IO port signal, so as to avoid the problem that the voltage value of the first interface signal increases too slowly because it does not vary accordingly when the external power source voltage is greater than the IO power source voltage, thereby avoiding the problem of electric leakage from the IO port to an IO power source in the IO circuit due to the too slowly increasing of the voltage value of the first interface signal, and thus improving the open-drain performance of the IO circuit.

In an optional solution, $1-V_t/V_{pad}$ is less than or equal to the percentage, which is less than or equal to $1-V_{th}/V_{pad}$. In this optional solution$_{[MAM1]}$, the gate voltage of the third PMOS transistor MP3 serving as the access control module will remain in the range of tolerance voltage $V_t$ all the way. Therefore, the problem of overvoltage of the third PMOS transistor MP3 may not occur in the access control signal generation circuit provided in this implementation, so that the IO circuit provided by the present disclosure may employ an external power source with broader voltage range, so as to further improve the open-drain performance and avoid the problem of reliability.

BRIEF DESCRIPTION OF THE DRAWINGS

The accompanying drawings constitute a part of this specification, describe exemplary embodiments and implementations of the present disclosure, and are used to explain the principles of the present disclosure together with this specification. In the accompanying drawings.

DETAILED DESCRIPTION

Exemplary embodiments and implementations of the present disclosure are described in detail with reference to the accompanying drawings. It should be understood that unless otherwise specifically described, relative arrangements, numerical expressions, and values of parts and steps stated in these embodiments and implementations should not be understood as limitations to the scope of the present disclosure.

It can be seen from the background that in an IO circuit of the prior art, when the difference between the external power source voltage and the core voltage is higher than the maximum value of the working voltage of a device, the IO circuit has poor open-drain output property in order to avoid the problem of reliability of the device.

Figure 1:
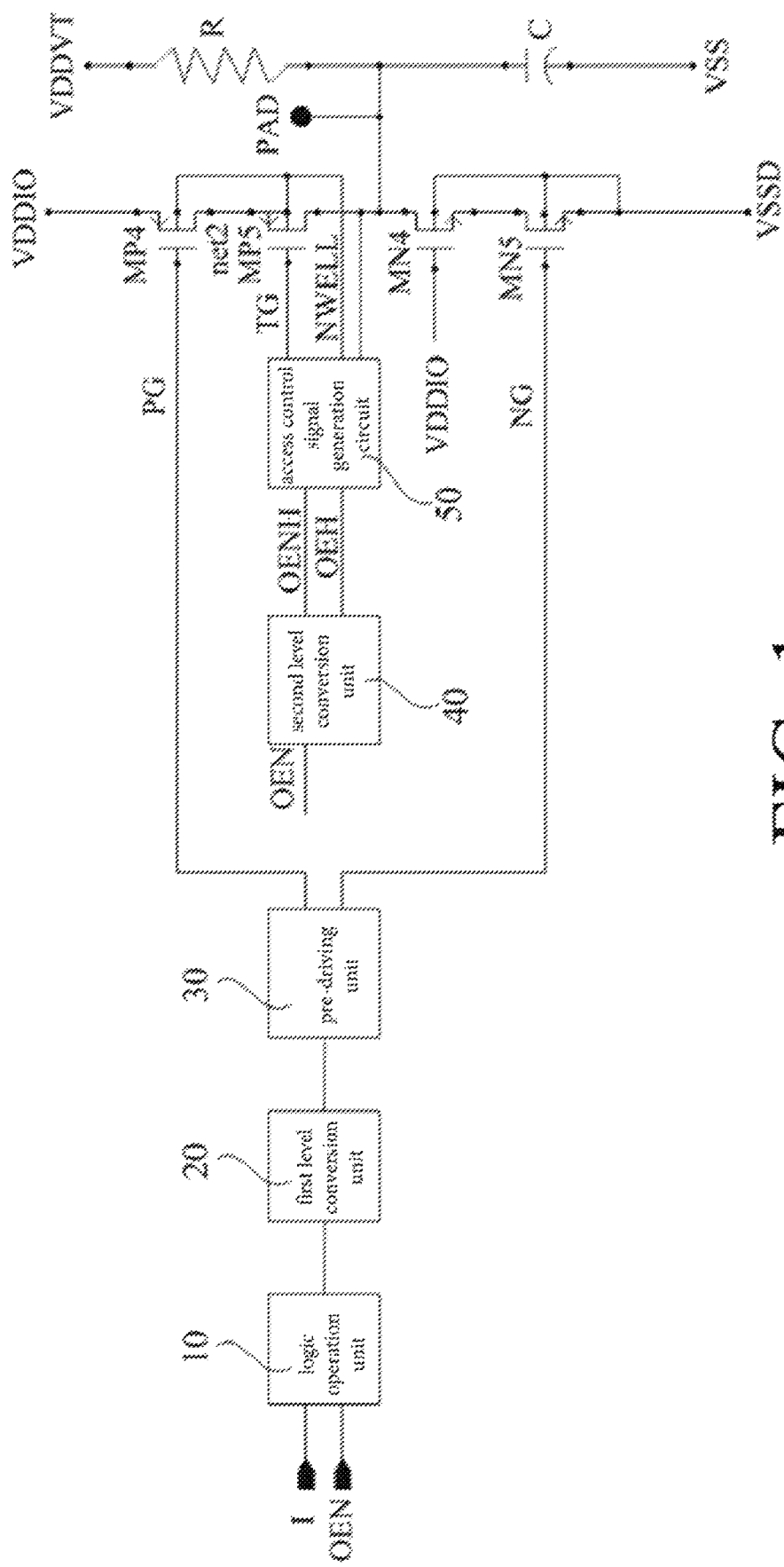
FIG. 1 is a schematic structural diagram of one implementation of an IO circuit having open-drain property.

Now, analysis is performed in detail in conjunction with an IO circuit. FIG. 1 is a schematic structural diagram of an IO circuit having open-drain property. In one form the IO circuit includes a logic module 10 having an input Core end I and an input Core enabling end OEN, and a first level conversion module 20 coupled with the logic module 10 and a pre-driving module 30 coupled with the first level conversion module 20, where the pre-driving module 30 outputs a pull-up control signal PG and a pull-down control signal NG.

The IO circuit further includes a second level conversion module 40 connected to the input Core enabling end OEN and outputting an internal enabling signal OENH and an enabling signal OEH, and an access control signal generation circuit 50 coupled with the second level conversion module 40, where the access control signal 50 is coupled with an IO port PAD and outputs a first interface signal TG and a second interface signal NWELL according to the internal enabling signal OENH and the enabling signal OEH.

The IO circuit additionally includes a fourth PMOS transistor MP4 and a fifth PMOS transistor MP5, where the source electrode of the fourth PMOS transistor MP4 is connected to an IO power source, the gate electrode is used to receive the pull-up control signal PG, the drain electrode is connected to the source electrode of the fifth PMOS transistor MP5, the gate electrode of the fifth PMOS transistor MP5 is used to receive the first interface signal TG, the drain electrode of the fifth PMOS transistor is connected to the IO port PAD, and a substrate of the fourth PMOS transistor is connected to a substrate of the fifth PMOS transistor and used to receive the second interface signal NWELL.

The IO circuit further includes a fourth NMOS transistor and a fifth NMOS transistor connected between the IO port PAD and a grounding end in series, where the drain electrode of the fourth NMOS transistor is connected to the IO port PAD, the gate electrode is connected to an IO power source VDDIO, the source electrode is connected to the drain electrode of the fifth NMOS transistor, the gate electrode of the fifth NMOS transistor is used to receive the pull-down control signal NG, and the source electrode is connected to the ground; a pull-up resistance R connected between an external power source VDDVT and the IO port PAD, where a voltage value of the external power source VDDVT is $VDD_{VT}$; and a capacitance C coupled with the pull-up resistance R, where one end of the capacitance C is connected to the IO port, and the other end is connected to the ground.

In a sending mode, the IO port PAD is not electrically connected to the resistance R. After a logic operation and a level conversion operation are performed on the input Core end I and the input Core enabling end OEN, the pull-up control signal PG and the pull-down control signal NG are IO signals. When the enabling end OEN is in logic high level, the pull-up control signal PG is in logic high level and the pull-down control signal NG is in logic low level, and therefore, the IO circuit is in a high impedance status; when the enabling end OEN is in logic low level, the pull-up control signal PG and the pull-down control signal NG are both in logic opposite to the input end I; when the fourth PMOS transistor MP4 is opened and the fifth NMOS transistor MN5 is closed, the IO port PAD is pulled up; and when the fourth PMOS transistor MP4 is closed and the fifth NMOS transistor MN5 is opened, the IO port PAD is pulled down.

In an open-drain mode, the IO port PAD is electrically connected to the resistance R and the capacitance C, and the external power source voltage is $VDD_{VT}$. The input Core end I and the input Core enabling end OEN remain switching synchronously, when the voltage value $V_{PAD}$ of the IO port increases to a value greater than the IO power source voltage $VDD_{IO}$, the voltage value $V_{NWELL}$ of the second interface signal is equivalent to the voltage value $V_{PAD}$ of the IO port, and therefore, the problem of current leakage from the IO port to the IO power source may not occur.

Figure 2:
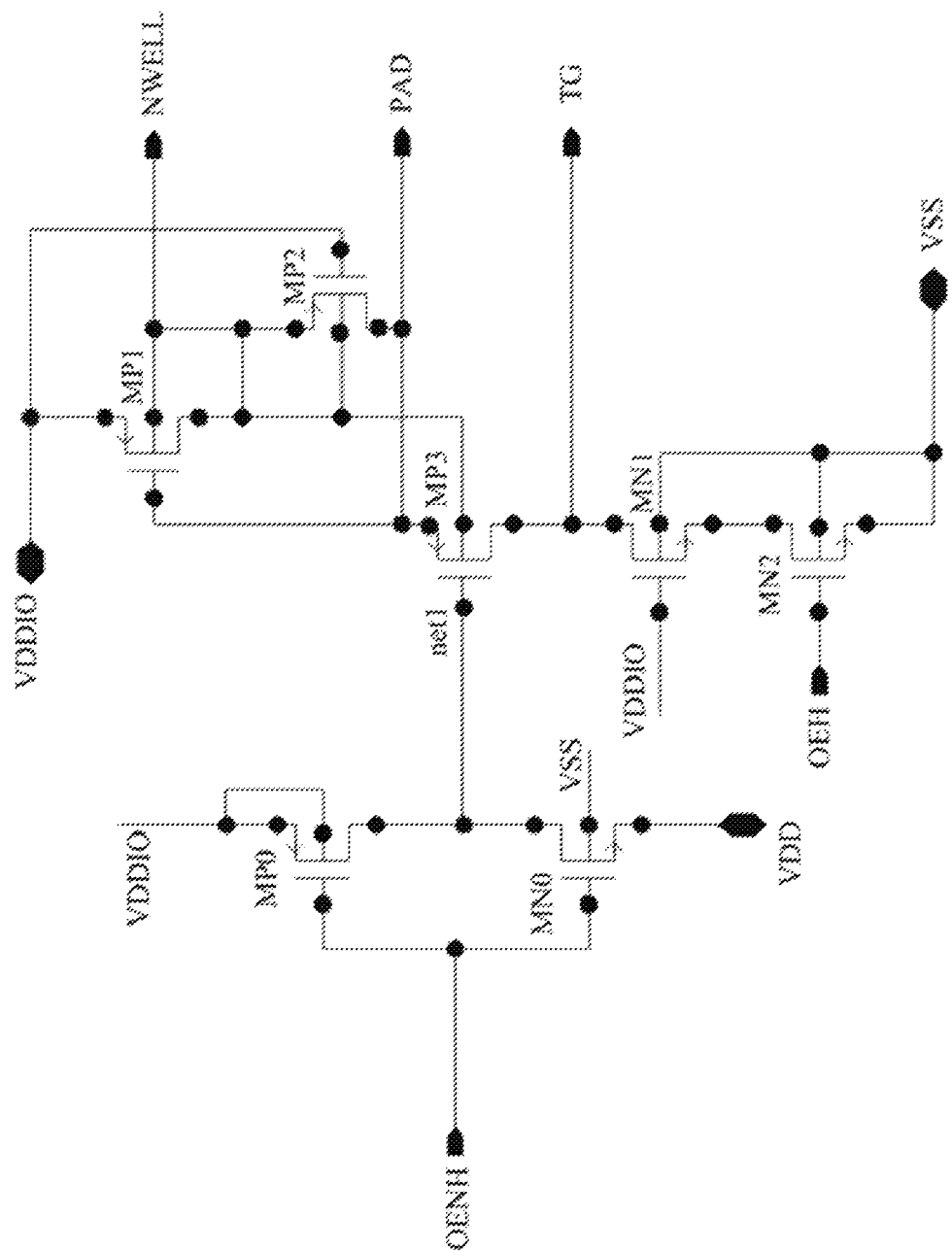
FIG. 2 is a circuit schematic structural diagram of one implementation of an access control signal circuit.

The access control signal generation circuit 50 plays an important role in whether the IO circuit is in the sending mode or the open-drain mode. Referring to FIG. 2, FIG. 2 is a circuit schematic structural diagram of an access control signal circuit, which is usually applied to the circumstance that the difference between the open-drain external power source voltage and the core voltage is within the working voltage of a device. Referring to FIG. 2, the access control signal circuit includes: an inverter, including a zeroth PMOS transistor MP0 and a zeroth NMOS transistor MN0, where the gate electrode of the zeroth PMOS transistor MP0 is coupled with the gate electrode of the zeroth NMOS transistor MN0 and used to receive the internal enabling signal OENH, the source electrode and a substrate of the zeroth PMOS transistor MP0 are used to connect to the IO power source, the drain electrode of the zeroth PMOS transistor MP0 is connected to the drain electrode of the zeroth NMOS transistor MN0 and has a node net1, and the source electrode of the zeroth NMOS transistor MN0 is used to connect to a core power source; a third PMOS transistor MP3, where the gate electrode of a third PMOS transistor MP3 is coupled with the node net1, the source electrode of the third PMOS transistor is connected to the IO port, and the drain electrode is used to generate the first interface signal TG; a higher-selection circuit, including a first PMOS transistor MP1 and a second PMOS transistor MP2, for generating the second interface signal NWELL based on the IO port PAD and the IO power source VDDIO, where the second interface signal NWELL is one with a larger voltage value of the IO port PAD and the IO power source VDDIO; a first NMOS transistor MN1, where the drain electrode of the first NMOS transistor MN1 is connected to the drain electrode of the third PMOS transistor MP3, and the gate electrode of the first NMOS transistor MN1 is connected to the IO power source VDDIO; and a second NMOS transistor MN2, where the drain electrode of the second NMOS transistor MN2 is connected to the source electrode of the first NMOS transistor MN1, and the gate electrode is used to receive the internal enabling signal OEH.

The internal enabling signal OENH is an IO signal and in the logic the same as the logic of the input enabling end OEN, and the enabling signal OEH is an IO signal and in the logic opposite to the logic of the input enabling end OEN.

In the sending mode, the input enabling end OEN is in logic low level, the internal enabling signal OENH is in logic low level, the OEH is in logic high level, the voltage value $V_{net1}$ of the node net1 is equivalent to the voltage value $VDD_{IO}$ of the IO power source VDDIO, the voltage value $V_{PAD}$ of the IO port is not higher than the IO power source voltage $VDD_{IO}$ anymore, and therefore, the first NMOS transistor and the second NMOS transistor are enabled and the third PMOS transistor MP3 is closed, the first interface signal TG is in logic low level, and the voltage value $V_{NWELL}$ of the second interface signal NWELL is equivalent to the voltage value $VDD_{IO}$ of the IO power source.

In the open-drain mode, the input Core enabling end OEN and the input Core end I are switched in the same logic. When the input enabling end OEN is in logic low level, functions implemented by the access control signal circuit are the same as functions implemented in the foregoing sending mode. When the input enabling end OEN is in logic high level, the internal enabling signal OENH is in logic high level, the OEH is in logic low level, the voltage $V_{net1}$ of the node net' is equal to the voltage $V_{DD}$ of the core power source of the inverter, the second NMOS transistor MN2 is closed, and therefore, when the IO port voltage $V_{PAD}$ is higher than the voltage $V_{DD}$ of the core power source by a threshold voltage $V_{th}$ of the third PMOS transistor, the third PMOS transistor MP3 is enabled immediately, and the voltage value $V_{TG}$ of the first interface signal TG increases to the voltage value $V_{PAD}$ of the IO port rapidly, so as to avoid the occurrence of an electric leakage path from the IO port to the IO power source through the fourth PMOS transistor MP4 and the fifth PMOS transistor MP5 when the IO port voltage $V_{PAD}$ is greater than the IO power source voltage $VDD_{IO}$, so that the IO port voltage $V_{PAD}$ may be pulled up from the resistance R to the voltage $VDD_{VT}$ of the external power source rapidly.

However, in the circumstance shown in FIG. 2, when the difference between the external power source voltage and the core power source voltage exceeds the working voltage of the device, the problem of overvoltage may occur to the third PMOS transistor MP3, thereby influencing the reliability of the IO circuit.

Figure 3:
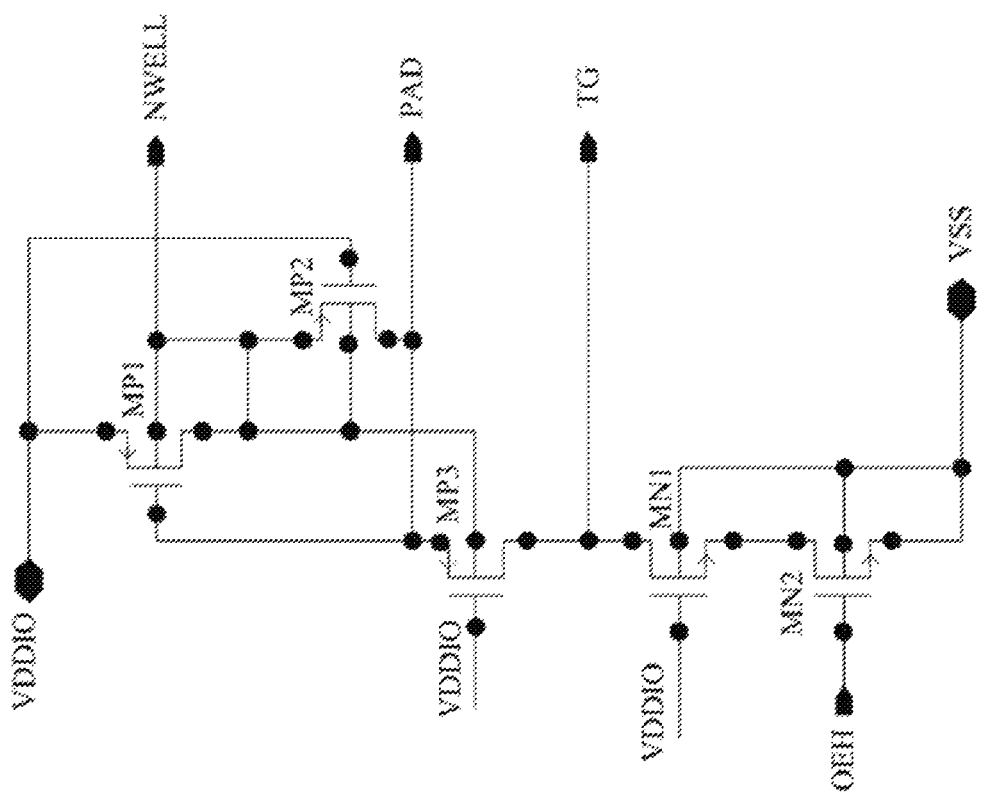
FIG. 3 is a circuit schematic structural diagram of another implementation of an access control signal circuit.

To this end, when the difference between the external power source voltage and the core voltage exceeds the working voltage of the device, an access control signal circuit as shown in FIG. 3 is employed. FIG. 3 is a circuit schematic structural diagram of another access control signal circuit, and differs from FIG. 2 in that the gate electrode of the third PMOS transistor is not coupled with the inverter anymore, but coupled with the IO power source. In the sending mode, functions implemented by the circuit shown in FIG. 3 are the same as functions implemented by the circuit shown in FIG. 2.

In the open-drain mode, when the internal enabling signal OEH is in logic low level, the voltage value $V_{PAD}$ of the IO port PAD and the voltage value $V_{TG}$ of the first interface signal TG may be pulled up to the voltage value $VDD_{VT}$ of the external power source through the pull-up resistance R as long as the voltage $V_{PAD}$ of the IO port PAD is high enough to open the third PMOS transistor MP3, so that the voltage value $V_{TG}$ of the first interface signal TG charged by the third PMOS transistor MP3 is equivalent to the IO port voltage $V_{PAD}$, thereby closing the electric leakage path from the IO port to the IO power source.

However, for the circuit shown in FIG. 3 in the open-drain mode, before the voltage value $V_{PAD}$ of the IO port and the voltage value $V_{TG}$ of the first interface signal TG may be pulled up to the voltage value $VDD_{VT}$ of the external power source through the pull-up resistance R, there exists the problem of electric leakage in the fourth PMOS transistor MP4 (as shown in FIG. 1) and the fifth PMOS transistor MP5 (as shown in FIG. 1). Before the voltage value $V_{PAD}$ of the IO port and the voltage value $V_{TG}$ of the first interface signal TG may be pulled up to the voltage value $VDD_{VT}$ of the external power source $VDD_{VT}$ through the pull-up resistance R, the first interface signal TG originally is in logic low level, the third PMOS transistor MP3 is closed, and in the circuit shown in FIG. 1, the fifth PMOS transistor MP5 is turned on, the voltage of a node net2 for the source electrode of the fifth PMOS transistor MP5 is $V_{net2}$, $V_{net2}$ increases with $V_{PAD}$, $V_{TG}$ is coupled through a gate-drain capacitance $C_{dg}$ of the fifth PMOS transistor MP5, and the speed of increasing of $V_{net2}$ is faster than that of the voltage value $V_{TG}$ of the first interface signal TG. Therefore, when $V_{net2}$ and $V_{PAD}$ are higher than $VDD_{IO}$ and are the sum of $VDD_{IO}$ and a threshold voltage $V_{th(MP4)}$ of the fourth PMOS transistor MP4, if $V_{TG}$ still remains low enough and the voltage value $V_{PAD}$ is greater than $V_{TG}$ to keep the fifth PMOS transistor MP5 turned on, the fourth PMOS transistor MP4 is in a sub-threshold status, thereby forming the electric leakage path from the IO port to the IO power source, which causes the IO port voltage $V_{PAD}$ to increase slowly, until the voltage $V_{TG}$ of the first interface signal TG increases to $V_{PAD}$ after being charged by the third PMOS transistor MP3 in the sub-threshold status, thereby turning off the fifth PMOS transistor MP5, so as to close the electric leakage path.

In order to address the foregoing problem, the present disclosure provides an access control signal generation circuit for an IO circuit, where a voltage value of a first interface signal generated by the access control signal changes according to a voltage value of an IO port signal in an open-drain mode, the open drain performance is improved when the difference between the external power source voltage and the core voltage is higher than the working voltage of a device, and the IO circuit may still guarantee the reliability of the device, so that the range of the external power source voltage may be broader, while meanwhile, a sending function of the IO circuit is kept unchanged.

To make the foregoing objectives, features and advantages of the present disclosure easier to understand, the specific embodiments and implementations of the present disclosure are described in detail below with reference to the accompanying drawings.

Figure 4:
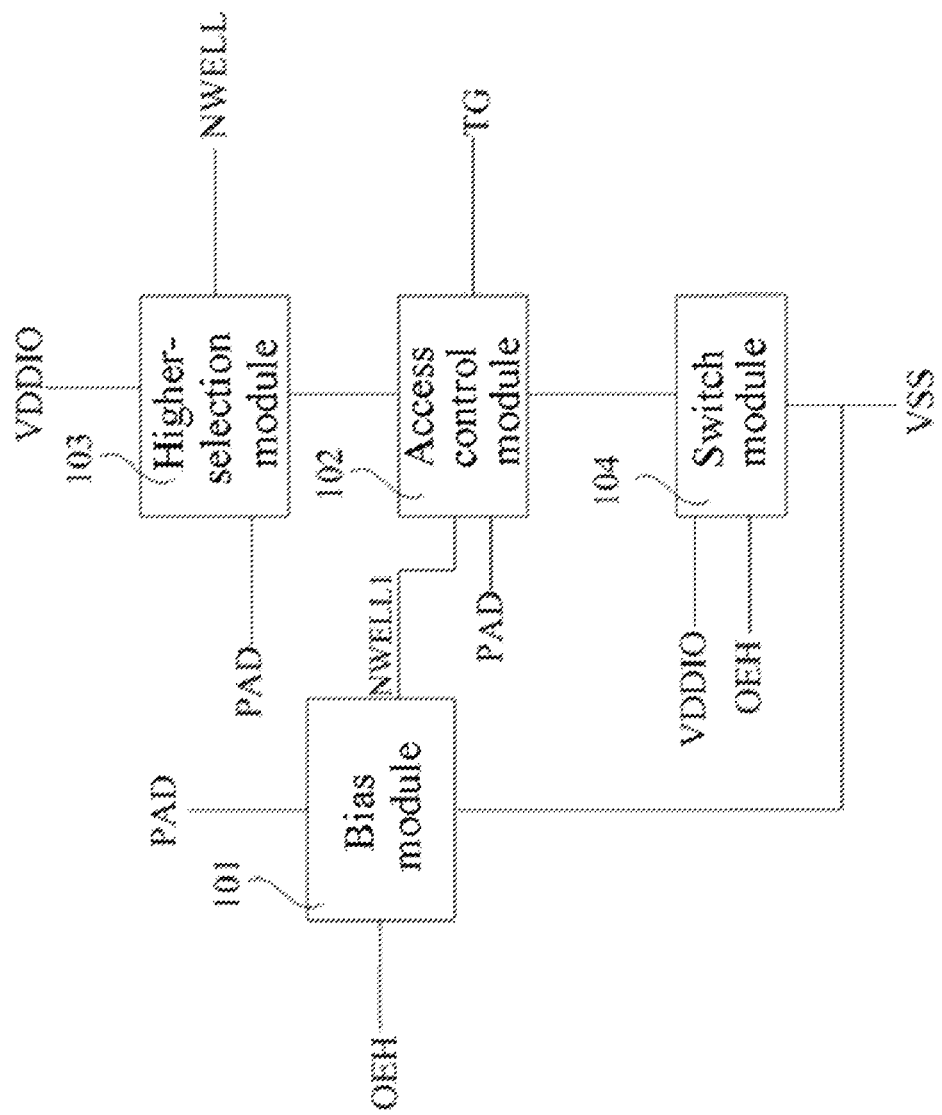
FIG. 4 is a structural block diagram of one implementation of an access control signal generation circuit for an IO circuit provided in some forms of the present disclosure.
Figure 5:
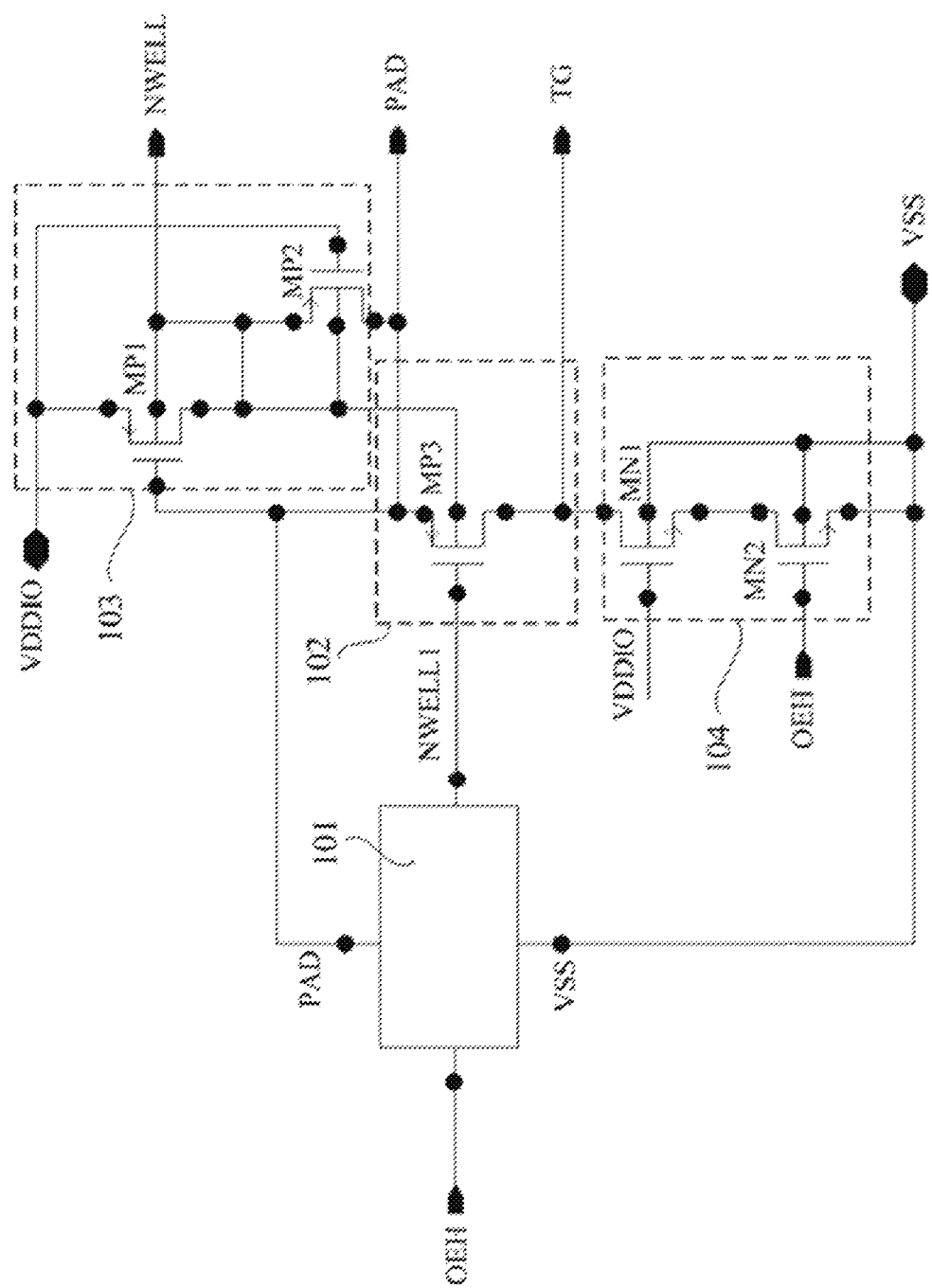
FIG. 5 is a circuit schematic structural diagram of the access control signal generation circuit for an IO circuit provided in some forms of the present disclosure.
Figure 6:
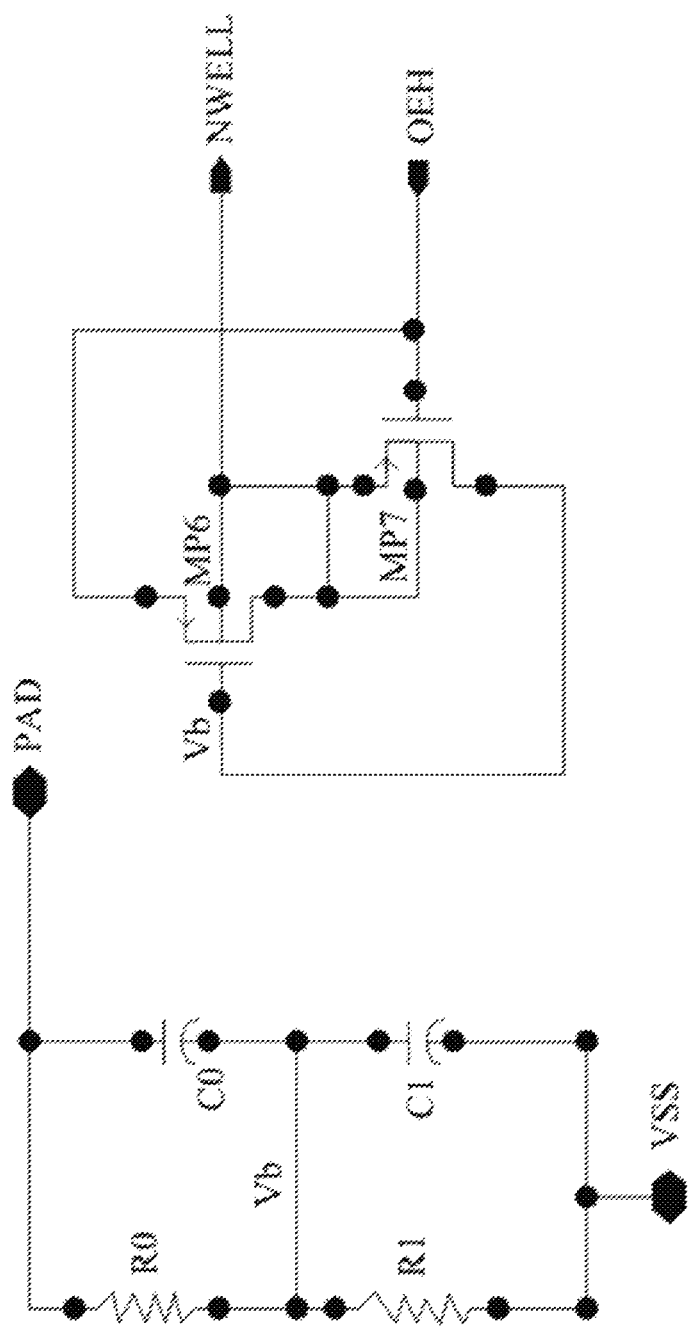
FIG. 6 is a circuit schematic structural diagram of a bias module of FIG. 5.

FIG. 4 is a structural block diagram of an access control signal generation circuit for an IO circuit provided in embodiments of the present disclosure, FIG. 5 is a circuit schematic structural diagram of the access control signal generation circuit for an IO circuit provided in the embodiments of the present disclosure, and FIG. 6 is a circuit schematic structural diagram of a bias module of FIG. 5.

Referring to FIG. 4 to FIG. 6, the access control signal generation circuit for an IO circuit includes:

a bias module 101 coupled with an IO port, for generating an access control signal NWELL1 according to an IO port signal PAD and an IO control signal OEH, where a voltage value $V_{NWELL1}$ of the access control signal NWELL1 is the maximum value of a voltage value of an IO port voltage division signal Vb and a voltage value $V_{OEH}$ of the IO control signal OEH, and a voltage value $V_b$ of the IO port voltage division signal $V_b$ is a % of a voltage value $V_{PAD}$ of the IO port signal PAD, where a is greater than 0 and less than 100;

an access control module 102 coupled with the bias module 101, for controlling cut-off or conduction according to the relationship between the access control signal NWELL1 and the IO port signal PAD received and outputting a first interface signal TG, where in an open-drain mode, when the IO control signal OEH is in logic low level, the access control module 102 is conducting and a voltage value $V_{TG}$ of the first interface signal TG varies according to the voltage value $V_{PAD}$ of the IO port signal PAD; and a higher-selection module 103 for generating a second interface signal NWELL according to an IO power source signal VDDIO and the IO port signal PAD, where a voltage value $V_{NWELL}$ of the second interface signal NWELL is the maximum value of a voltage value $VDD_{IO}$ of the IO power source signal VDDIO and the voltage value $V_{PAD}$ of the IO port signal PAD.

Description will be detailed in conjunction with the accompanying drawings below.

In the bias module 101, the voltage value of the IO port voltage division signal Vb is $V_b$, and $V_b$=a % $V_{PAD}$. When the IO circuit is in the open-drain mode and the IO control signal OEH is in logic low level, the voltage value $V_{NWELL1}$ of the access control signal NEWLL1 is equal to the voltage value $V_b$ of the IO port voltage division signal Vb, that is, $V_{NWELL1}=V_b$=a % $V_{PAD}$, the access control module 102 is conducting, and the voltage $V_{TG}$ of the first interface signal TG varies according to the voltage value $V_{PAD}$ of the IO port signal PAD.

When the voltage value $V_{NWELL1}$ of the access control signal NWELL1 is equal to the voltage value $V_b$ of the IO port voltage division signal Vb, the access control module 102 is conducting.

Specifically, in the open-drain mode, the voltage value $V_{TG}$ of the first interface signal TG will increase to the voltage value $V_{PAD}$ of the IO port PAD rapidly, thereby avoiding the occurrence of an electric path from the IO port PAD to an IO power source VDDIO when the voltage value $V_{PAD}$ of the IO port PAD is higher than the voltage value $VDD_{IO}$ of the IO power source VDDIO, so that the voltage value $V_{PAD}$ of the IO port PAD may be pulled up to the voltage value $VDD_{VT}$ of an external power source VDDVT (not shown) rapidly. That is to say, in some implementations, the IO circuit is in the open-drain mode, and the voltage value $V_{TG}$ of the first interface signal TG may vary according to the voltage value $V_{PAD}$ of the IO port signal, so as to avoid the problem that the voltage value $V_{TG}$ of the first interface signal TG increases too slowly because it does not vary according to $V_{PAD}$, thereby avoiding the problem of the electric leakage path from the IO port PAD to an IO power source VDDIO in the IO circuit due to the too slowly increasing of the voltage value $V_{TG}$ of the first interface signal TG, and avoiding the occurrence of the problem that $V_{PAD}$ increases slowly when it rises to the IO power source voltage plus the threshold voltage $V_{th}$ of a PMOS transistor, thus improving the open-drain performance of the IO circuit.

In some implementations, the access control module 102 includes: a third PMOS transistor MP3, where the gate electrode of the third PMOS transistor MP3 receives the access control signal NWELL1, the source electrode of the third PMOS transistor MP3 receives the IO port signal PAD, and the drain electrode of the third PMOS transistor MP3 receives the first interface signal TG.

In a sending mode, when the IO control signal OEH is in logic high level, the first interface signal TG is logic low level, and the access control module 102 is cut off. Specifically, when the IO control signal is in logic high level, an internal pull-down module is enabled; the voltage value $V_{PAD}$ of the IO port signal PAD is not higher than the voltage value $VDD_{IO}$ of the IO power source signal VDDIO, the voltage value $V_b$ of the IO port voltage division signal Vb is not higher than half of the voltage value $VDD_{IO}$ of the IO power source signal VDDIO, and the voltage value $V_{NWELL1}$ of the access control signal NWELL1 is equivalent to the voltage value $VDD_{IO}$ of the IO power source signal VDDIO; therefore, the access control module 102 is cut off, that is to say, the third PMOS transistor MP3 is cut off, and the first interface signal TG is in logic low level.

The threshold voltage of the third PMOS transistor MP3 is $V_{th}$, the tolerance voltage of the third PMOS transistor MP3 is $V_t$, and in order to ensure that the third PMOS transistor MP3 may be enabled and working normally, $V_{th} \leq V_{PAD}-V_b \leq V_t$, $V_b$=a % $V_{PAD}$, that is to say, $V_{th} \leq V_{PAD}-$a % $V_{PAD} \leq V_t$, thus obtaining the range of values of a, that is, $1-V_t/V_{pad} \leq$ a % $\leq 1-V_{th}/V_{pad}$. When the values of a satisfy this range, the gate voltage of the third PMOS transistor MP3 will remain in the range of the tolerance voltage $V_t$ all the way, and therefore, the problem of overvoltage of the third PMOS transistor MP3 may not occur in the access control signal generation circuit provided in some implementations. Therefore, the feature a satisfies the following condition: $1-V_t/V_{pad} \leq$ a % $1-V_{th}/V_{pad}$.

In some implementations, a % is ½, that is to say, when the IO control signal OEH is in logic low level, the voltage value $V_{NWELL1}$ of the access control signal NWELL1 is half of the voltage value $V_{PAD}$ of the IO port signal PAD, and therefore, when the voltage value $V_{PAD}$ of the IO port PAD is higher than 2 times the threshold voltage of the third PMOS transistor MP3, that is, higher than $2V_{th}$, the third PMOS transistor MP3 may be opened, and the voltage value $V_{TG}$ of the first interface signal TG will increase to the voltage value $V_{PAD}$ of the IO port PAD rapidly, so as to prevent the electric path from occurring when the voltage value $V_{PAD}$ of the IO port PAD is higher than the voltage value $VDD_{IO}$ of the IO power source VDDIO, ensure that the voltage value $V_{PAD}$ of the IO port PAD is pulled up to the voltage value $VDD_{VT}$ of the external power source VDDVT through an external pull-up resistance, and improve the electrical property in the open-drain mode.

It should be noted that when the voltage value of the IO port PAD is greater than or equal to the voltage value of the IO power source voltage, the values of a still satisfy the following: $1-V_t/V_{pad} \leq a \% \leq 1-V_{th}/V_{pad}$.

Referring to FIG. 6, FIG. 6 is a circuit schematic structural diagram of the bias module 101 of FIG. 5. In some implementations, the bias module 101 includes: a voltage division unit for generating the IO port voltage division signal Vb according to the voltage dividing of the IO port signal PAD; and a higher-selection unit coupled with the voltage division unit, for outputting the access control signal NWELL1 according to the IO port voltage division signal Vb and the IO control signal OEH.

As shown in FIG. 6, the voltage division unit includes a first resistance R0 and a second resistance R1 connected in series, where one end of the first resistance R0 receives the IO port signal PAD, the other end is coupled with the second resistance R1 and generates the IO port voltage division signal Vb, and an end, which is not connected to the first resistance R0, of the second resistance R1 is connected to the ground VSS.

The ratio of resistance values of the first resistance R0 and the second resistance R1 is determined according to the range of values of the feature a determined previously. In some implementations, the resistance values of the first resistance R0 and the second resistance value R1 are equal.

In some implementations, the voltage division unit further includes: a first capacitance C0 connected in parallel with the first resistance r0; and a second capacitance C1 connected in parallel with the second resistance R1. The first capacitance C0 and the second capacitance C1 perform dynamic voltage division and voltage stabilization on the voltage division unit.

The higher-selection unit implements the function of selecting a higher voltage value to output, so that output access control signal NWELL1 is of the maximum value of the voltage values of the IO port voltage division signal Vb and the IO control signal OEH.

In some implementations, the higher-selection unit includes: a sixth PMOS transistor MP6 and a seventh PMOS transistor MP7, where the source electrode of the sixth PMOS transistor MP6 is coupled with the gate electrode of the seventh PMOS transistor MP7 and receives the IO control signal OEH, the gate electrode of the sixth PMOS transistor MP6 is coupled with the drain electrode of the seventh PMOS transistor MP7 and receives the IO port voltage division signal Vb, and the drain electrode and a substrate of the sixth PMOS transistor MP6 are coupled with a substrate and the source electrode of the seventh PMOS transistor MP7 and output the access control signal NWELL1.

The higher-selection module 103 is used to output a larger one of the voltage values of the IO port PAD and the IO power source signal VDDIO, so as to generate a second interface signal NWELL. In some implementations, the higher-selection module 103 includes: a first PMOS transistor MP1 and a second PMOS transistor MP2, where the source electrode of the first PMOS transistor MP1 is coupled with the gate electrode of the second PMOS transistor MP2 and receives the IO power source signal VDDIO, the gate electrode of the first PMOS transistor MP1 is coupled with the drain electrode of the second PMOS transistor MP2 and receives the IO port signal PAD, the drain electrode of the first PMOS transistor MP1 is coupled with a substrate, and the source electrode of the second PMOS transistor MP2 is coupled with a substrate and outputs the second interface signal NWELL.

The access control signal generation circuit further includes: a switch module 104 coupled with the access control module 102, where one end of the switch module 104 is connected to the ground, and the other end outputs the first interface signal TG, where when the IO control signal OEH is in logic high level, the switch module 104 is enabled, and the first interface signal TG is in logic low level.

Specifically, the switch module 104 is used to cause the first interface signal TG to be in logic low level in a sending mode, and in an open-drain mode, when the IO control signal OEH is in logic high level, the first interface signal TG is in logic low level.

In some implementations, the switch module 104 includes: a first NMOS transistor MN1 and a second NMOS transistor MN2 connected in series, where the gate electrode of the first NMOS transistor MN1 is used to receive the IO power source signal VDDIO, the drain electrode of the first NMOS transistor MN1 outputs the first interface signal, the gate electrode of the second NMOS transistor MN2 receives the IO control signal OEH, the drain electrode of the second NMOS transistor MN2 is coupled with the source electrode of the first NMOS transistor MN1, and the source electrode of the second NMOS transistor MN2, a substrate of the second NMOS transistor MN2, and a substrate of the first NMOS transistor MN1 are all connected to the ground VSS.

In the access control signal generation circuit for an IO circuit provided in some implementations, the voltage value $V_{TG}$ of the first interface signal TG may vary according to the voltage value $V_{PAD}$ of the IO port signal PAD in the open-drain mode and when OEH is in logic low level, so as to avoid the problem that the voltage value $V_{TG}$ of the first interface signal TG increases too slowly in the open-drain mode because it does not vary according to $V_{PAD}$, thereby avoiding the problem of the electric leakage path from the IO port PAD to the IO power source VDDIO in the IO circuit due to the too slowly increasing of the voltage value $V_{TG}$ of the first interface signal TG, and avoiding the occurrence of the problem that PAD is pulled up slowly when $V_{PAD}$ rises to the IO power source voltage $VDD_{IO}$ plus the threshold voltage $V_{th}$ of the third PMOS transistor MP3, thus improving the open-drain performance of the IO circuit. Moreover, in the access control signal generation circuit provided in some implementations, an external power source with a voltage value the same as or higher than the voltage value of the IO power source may be used, so as to improve the open-drain performance of the IO circuit, while ensuring that functions of the sending mode of the IO circuit are unchanged.

Meanwhile, in some implementations, the tolerance voltage of the third PMOS transistor MP3 is $V_t$, the gate-source voltage of the third PMOS transistor MP3 $V_{GS}=V_{PAD}-V_{NWELL1}$, and $V_{NWELL1}=a \% V_{PAD}$, that is to say, the gate-source voltage of the third PMOS transistor MP3 $V_{GS}=V_{PAD}-a \% V_{PAD}$; since $1-V_t/V_{pad} \leq a \%$, the gate-source voltage $V_{GS}$ is within the range of the tolerance voltage $V_t$ of the third PMOS transistor MP3, so as to ensure that the problem of overvoltage may not occur to the third PMOS transistor MP3, thereby ensuring that the IO circuit still has high reliability although the difference between the external power source voltage and the core voltage is higher than the maximum value of the working voltage of a device. Therefore, the range of the external power source voltage that can be employed in the open-drain mode of the IO circuit may be broader, and the functions of the sending mode of the IO circuit are unchanged.

Figure 7:
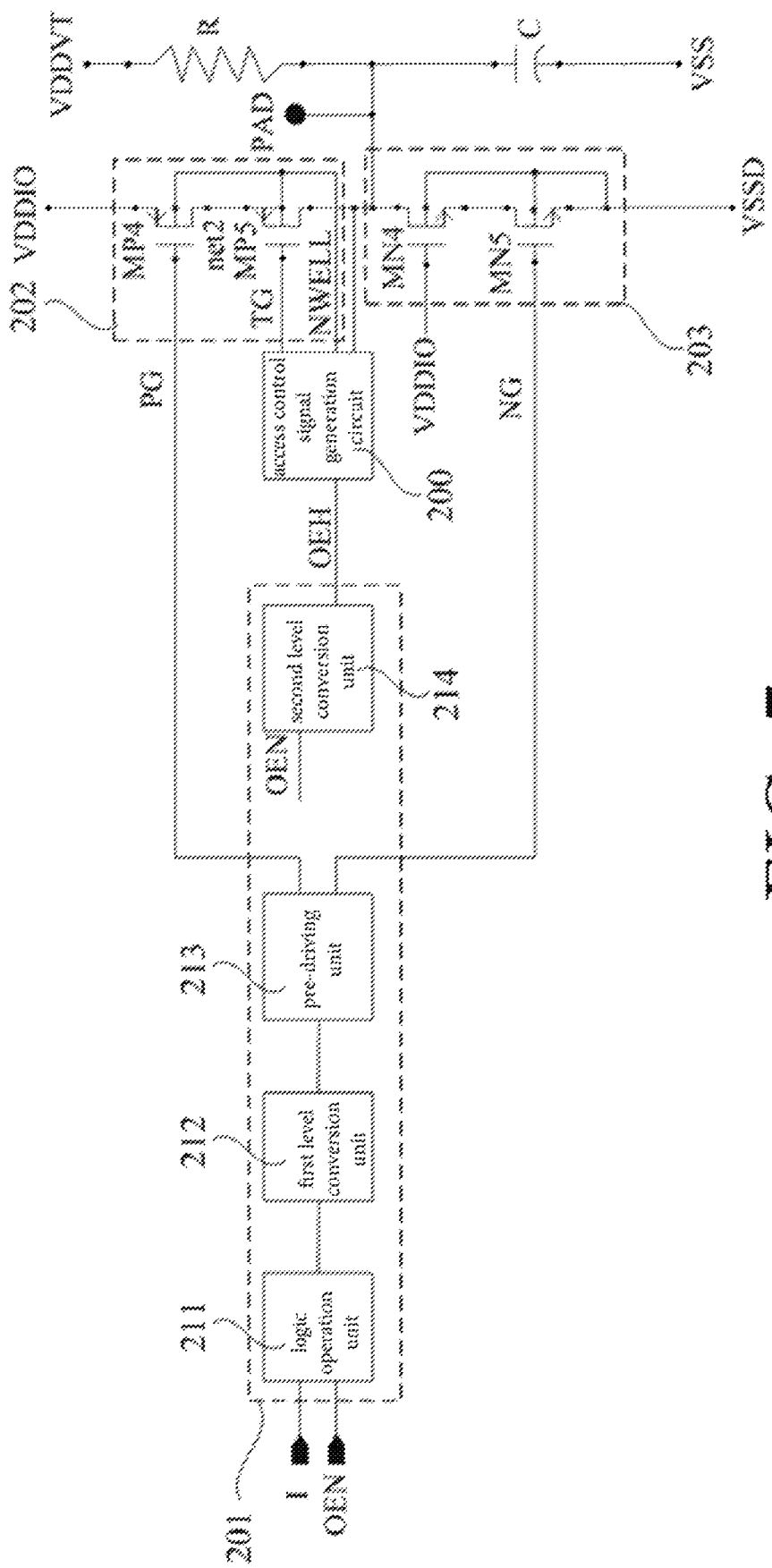
FIG. 7 is a schematic structural diagram of the IO circuit provided in some forms of the present disclosure.

Implementations of the present disclosure further provide an IO circuit employing the access control signal generation circuit described above. FIG. 7 is a schematic structural diagram of the IO circuit provided in some implementations of the present disclosure.

Referring to FIG. 7, the IO circuit includes: the access control signal generation circuit 200 described above; a logic conversion module 201 for receiving an input Core signal I and an input Core control signal OEN and outputting the IO control signal OEH and an internal pull-up control signal PG; an internal pull-up module 202 coupled with the access control signal generation circuit 200, for receiving the internal pull-up control signal PG, the IO power source signal VDDIO, the IO port signal PAD, the first interface signal TG, and the second interface signal NWELL, conducting and pulling the IO port PAD up when the input Core signal I is in logic high level and the input Core control signal OEN is in logic low level, and being cut off in the open-drain mode; and an external pull-up resistance R connected between an external power source VDDVT and the IO port PAD in series, where the IO port PAD is pulled up through the external pull-up resistance R in the open-drain mode.

For the specific description about the access control signal circuit, reference can be made to the corresponding description in the implementations described above, and details are not described again herein.

The logic conversion module 201 includes: a logic operation unit 211 for receiving the input Core signal I and the input Core control signal OEN; a first level conversion unit 212 coupled with the logic operation unit 211; and a pre-driving unit 213 coupled with a first level conversion unit 212, for outputting the internal pull-up control signal PG.

The logic conversion module 201 further includes: a second level conversion unit 214 coupled with the access control signal generation circuit, where a second level conversion unit 214 outputs the IO control signal OEH based on the input Core control signal OEN, and the IO control signal OEH and the input Core control signal OEN are in opposite logic.

The internal pull-up module 202 includes: a fourth PMOS transistor MP4 and a fifth PMOS transistor MP5, where the gate electrode of the fourth PMOS transistor MP4 receives the internal pull-up control signal PG, the source electrode is used to receive the IO power source signal VDDIO, and the drain electrode is coupled with the source electrode of the fifth PMOS transistor MP5; and where the gate electrode of the fifth PMOS transistor MP5 receives the first interface signal TG, the drain electrode is coupled with the IO port PAD, and a substrate of the fifth PMOS transistor MP5 and a substrate of the fourth PMOS transistor MP4 are coupled with the second interface signal NWELL.

A node net2 is coupled between the source electrode of the fifth PMOS transistor MP5 and the drain electrode of the fourth PMOS transistor MP4.

The logic conversion module 201 further outputs an internal pull-down control signal NG; and the IO circuit further includes: an internal pull-down module 203 coupled with the internal pull-up module 202 and receiving the IO power source signal VDDIO, which pulls the IO port PAD down based on the internal pull-down control signal NG in a sending mode, where the IO port PAD is pulled down when the input Core signal I is in logic low level and the input Core control signal OEN is in logic low level.

Specifically, in some implementations, the internal pull-down module 203 includes: a fourth NMOS transistor MN4 and a fifth NMOS transistor MN5, where the drain electrode of the fourth NMOS transistor MN4 is connected to the IO port PAD, the gate electrode receives the IO power source signal VDDIO, and the source electrode is coupled with the drain electrode of the fifth NMOS transistor MN5; and where the gate electrode of the fifth NMOS transistor MN5 receives the internal pull-down control signal NG, and the drain electrode, a substrate, and the source electrode are coupled with a substrate of the fourth NMOS transistor MN4 and connected to the ground VSS.

In the sending mode, the IO port PAD is not electrically connected to the external pull-up resistance R, and after the logic conversion module 201 performs a logic operation and a level increasing operation on the input Core signal I and the input Core control signal OEN, the internal pull-up control signal PG and the internal pull-down control signal NG are IO signals. When the input Core control signal OEN is in logic high level, the internal pull-up control signal PG is in logic high level and the internal pull-down control signal NG is in logic low level, the IO circuit is in a high impedance status at this time; when the input Core signal I is in logic high level and the input Core control signal OEN is in logic low level, the internal pull-up control signal PG and the internal pull-down control signal NG are both switched to the logic opposite to the input Core signal I, so as to open the fourth PMOS transistor MP4 and close the fifth NMOS transistor MN5, thereby pulling the IO port PAD up; and when the input Core signal I is in logic low level and the input Core control signal OEN is in logic low level, the fourth PMOS transistor MP4 is closed and the fifth NMOS transistor MN5 is opened, thereby pulling the IO port PAD down to implement the function of sending.

One end of the external pull-up resistance R is used to receive the external power source signal VDDVT, and the other end is used to receive the IO port signal PAD. In some implementations, the IO circuit further includes: an external load capacitance C coupled with the external pull-up resistance, where one end of the external load capacitance C is connected to the IO port PAD, and the other end is connected to the ground VSS.

The IO port PAD is pulled up through the external pull-up resistance R in the open-drain mode. Specifically, in the open-drain mode, the input Core control signal OEN is in logic high level, the internal pull-up control signal PG is in logic high level, and the internal pull-down control signal NG is in logic low level. Specifically, in the open-drain mode, when the input Core control signal OEN is in logic low level, the IO control signal OEH is in logic high level, and functions implemented by the IO circuit are the same as functions implemented by the IO circuit in the sending mode previously; when the input Core control signal OEN is in logic high level, the IO control signal OEH is in logic low level, and the voltage value $V_{NWELL1}$ of the access control signal NWELL1 of the access control signal generation circuit is equal to the voltage value $V_b$ of the IO port voltage division signal Vb; when a % being ½ is used as an example, and the voltage value $V_b$ of the IO port voltage division signal Vb is half of the voltage value $V_{PAD}$ of the IO port PAD; therefore, when $V_{PAD}$ is higher than 2 times the threshold voltage of the third PMOS transistor, that is, $V_{PAD}$ is greater than 2Vth, the voltage value $V_{TG}$ of the first interface signal TG will increase to $V_{PAD}$ rapidly, so that the voltage value $V_{PAD}$ of the IO port PAD may be pulled up to the voltage value $VDD_{VT}$ of the external power source VDDVT rapidly through the external pull-up resistance R.

That is to say, the voltage value $V_{TG}$ of the first interface signal TG varies according to $V_{PAD}$, so as to avoid the enabling of the fourth PMOS transistor MP4 and the fifth PMOS transistor MP5 when the voltage value VPAD of the IO port PAD is greater than the voltage value VDDIO of the IO power source VDDIO, thereby avoiding an electric leakage path caused by the enabling of the internal pull-up module 202, and improving the open-drain property.

Moreover, in some implementations, by setting the value of a %, that is, the ratio between the voltage value of the IO port voltage division signal and the voltage value of the IO port signal, the gate-source voltage of the third PMOS transistor MP3 may remain within the range of tolerance voltages all the way, so that the problem of overvoltage may not occur, thereby ensuring that the IO circuit has high reliability, and therefore, in the IO circuit provided in some implementations, an external power source VDDVT with broader voltage range may be applied to the open-drain mode, and the functions of the sending mode of the IO circuit may remain unchanged. For example, the IO circuit provided in some implementations may not only be applied to the event that the voltage value of the external power source VDDVT is greater than or equal to the voltage value of the IO power source VDDIO, but also may be applied to the event that the difference between voltage values of the external power source VDDVT and the core power source is higher than the maximum value of the working voltage of the device.

Figure 8:
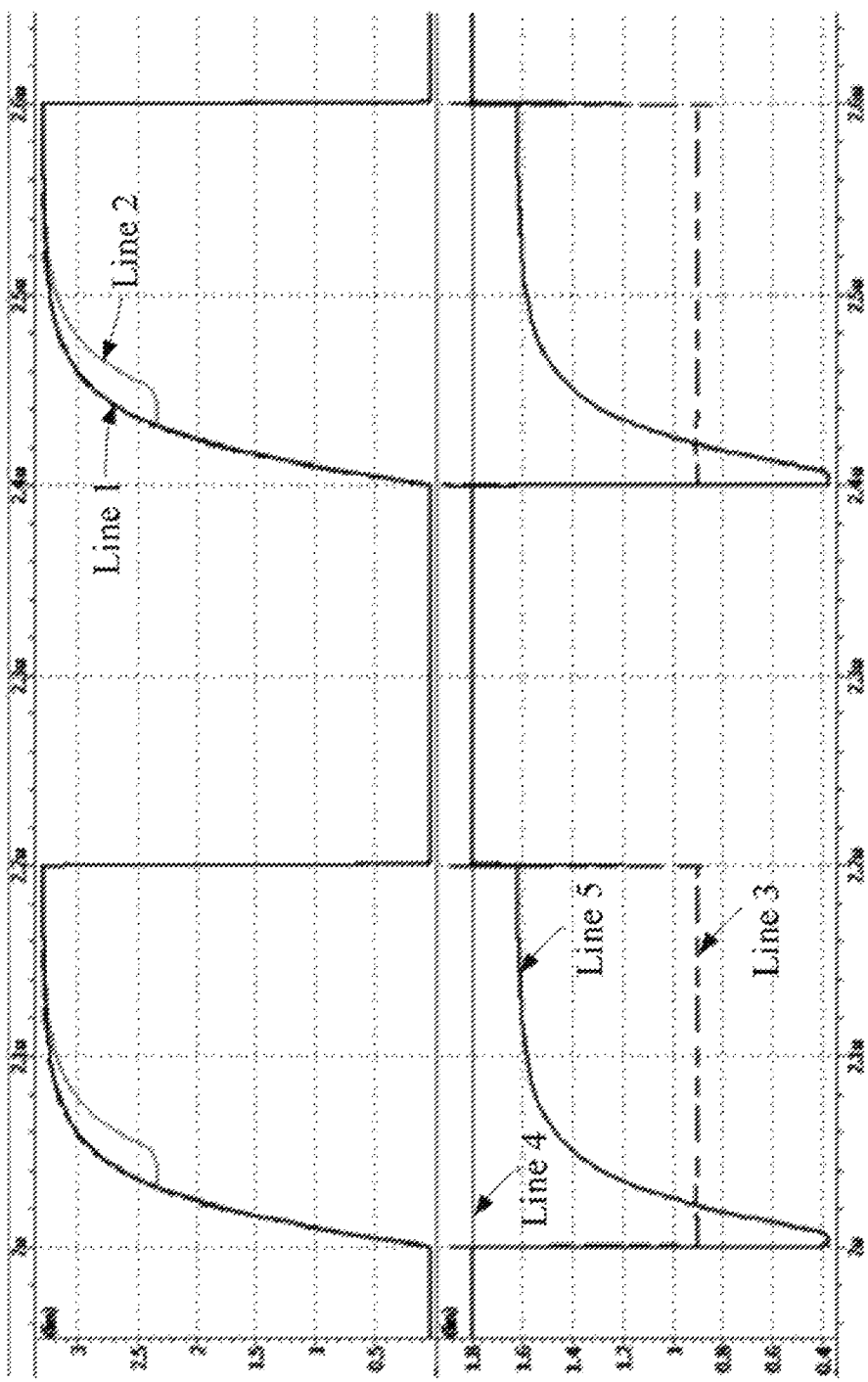
FIG. 8 and FIG. 9 illustrate schematic diagrams of simulation results of an IO circuit employing the access control signal generation circuit shown in FIG. 2 and FIG. 3 and the IO circuit in forms of the present disclosure in an open-drain mode.

FIG. 8 shows a schematic diagram of simulation results of an IO circuit employing the access control signal generation circuit shown in FIG. 2 and FIG. 3 and the IO circuit in some implementations in an open-drain mode. The upper graph in FIG. 8 is a simulation waveform for the voltage value $V_{PAD}$ of the IO port PAD, and the lower graph in FIG. 8 is a simulation waveform for the gate voltage of the third PMOS transistor MP3. Line 1 is a simulation waveform for the voltage value $V_{PAD}$ of the IO port PAD of the IO circuit corresponding to FIG. 2 and the IO circuit provided in some implementations, line 2 is a simulation waveform for the voltage value $V_{PAD}$ of the 10 port PAD of the IO circuit corresponding to FIG. 3, line 3 is a simulation waveform for the gate voltage V(gate) of the third PMOS transistor MP3 of the IO circuit diagram corresponding to FIG. 2, line 4 is a simulation waveform for the gate voltage V(gate) of the third PMOS transistor MP3 of the IO circuit corresponding to FIG. 3, and line 5 is a simulation waveform for the gate voltage V(gate) of the third PMOS transistor MP3 of the IO circuit provided in some implementations.

The gate voltage is the voltage difference between the gate electrode of the third PMOS transistor MP3 and zero potential.

The simulation condition shown in FIG. 8 includes: in the open-drain mode, the voltage value $VDD_{VT}$ of the external power source VDDVT is 3.3 V, the voltage value $VDD_{IO}$ of the IO power source VDDIO is 1.8 V, and the voltage value of the core power source is 0.9 V.

In the IO circuit corresponding to FIG. 2, according to the simulation waveforms shown by line 1 and line 3, the voltage value $V_{net1}$ of the node net1 is the voltage value of the core voltage, that is, $V_{net1}$=0.9 V, and although the simulation waveform for the IO port PAD is good for open-drain output, the IO circuit has the problem that the reliability becomes poor. This is because the maximum value of the working voltage of the third PMOS transistor MP3 is 1.98V, and when the voltage value $V_{PAD}$ of the IO port PAD is pulled up to the voltage value $VDD_{VT}$ of the external power source VDDVT, that is, $V_{PAD}$ is pulled up to 3.3 V, the gate-source voltage $V_{gs}$ of the third PMOS transistor MP3 is 2.4 V, that is, the gate-source voltage $V_{gs}$ of the third PMOS transistor MP3 is higher than the maximum value of the working voltage, which results in the problem of overvoltage in the third PMOS transistor MP3, thus causing the reliability to become poor in the IO circuit.

In the IO circuit corresponding to FIG. 3, according to the simulation waveforms shown by line 2 and line 4, the gate voltage of the third PMOS transistor MP3 is a fixed value, V(gate) is the same as the voltage value $VDD_{IO}$ of the IO power source VDDIO, and therefore, V(gate)=1.8 V, so that the third PMOS transistor MP3 does not have the problem of overvoltage. However, in the open-drain mode, in the process of pulling the voltage value of the IO port PAD up to the voltage value VDDVT of the external power source VDDVT', the voltage value of the first interface signal TG may not be pulled up according to PAD in time, and thus the voltage value of the first interface signal TG increases slowly, so that there is an electric leakage path from the IO port PAD to the IO power source VDDIO; therefore, it can be seen from the poor simulation waveform morphology of $V_{PAD}$ in the process of pulling the voltage value of the IO port PAD up to the voltage value of VDDIO that the property of open drain is poor.

In the IO circuit provided in some implementations, according to the simulation waveforms shown by line 1 and line 5, in the open-drain mode, the waveform for the voltage value $V_{PAD}$ of the IO port PAD corresponds to the waveform for the voltage value $V_{PAD}$ of the IO circuit corresponding to FIG. 2, which shows that the IO circuit provided in some implementations has excellent open-drain performance. Meanwhile, in the process of pulling the voltage value $V_{PAD}$ of the IO port PAD up to the voltage value of the external power source VDDVT, that is, 3.3 V, the gate voltage V(gate) of the third PMOS transistor MP3 is half of $V_{PAD}$; therefore, in this process, the gate voltage V(gate) of the third PMOS transistor MP3 is less than or equal to 1.65 V, and the gate voltage V(gate) is less than the maximum value of the working voltage of the third PMOS transistor MP3, 1.8 V, so that the IO circuit provided in some implementations does not have the problem of overvoltage in the third PMOS transistor MP3, and correspondingly, the IO circuit has high reliability.

Figure 9:
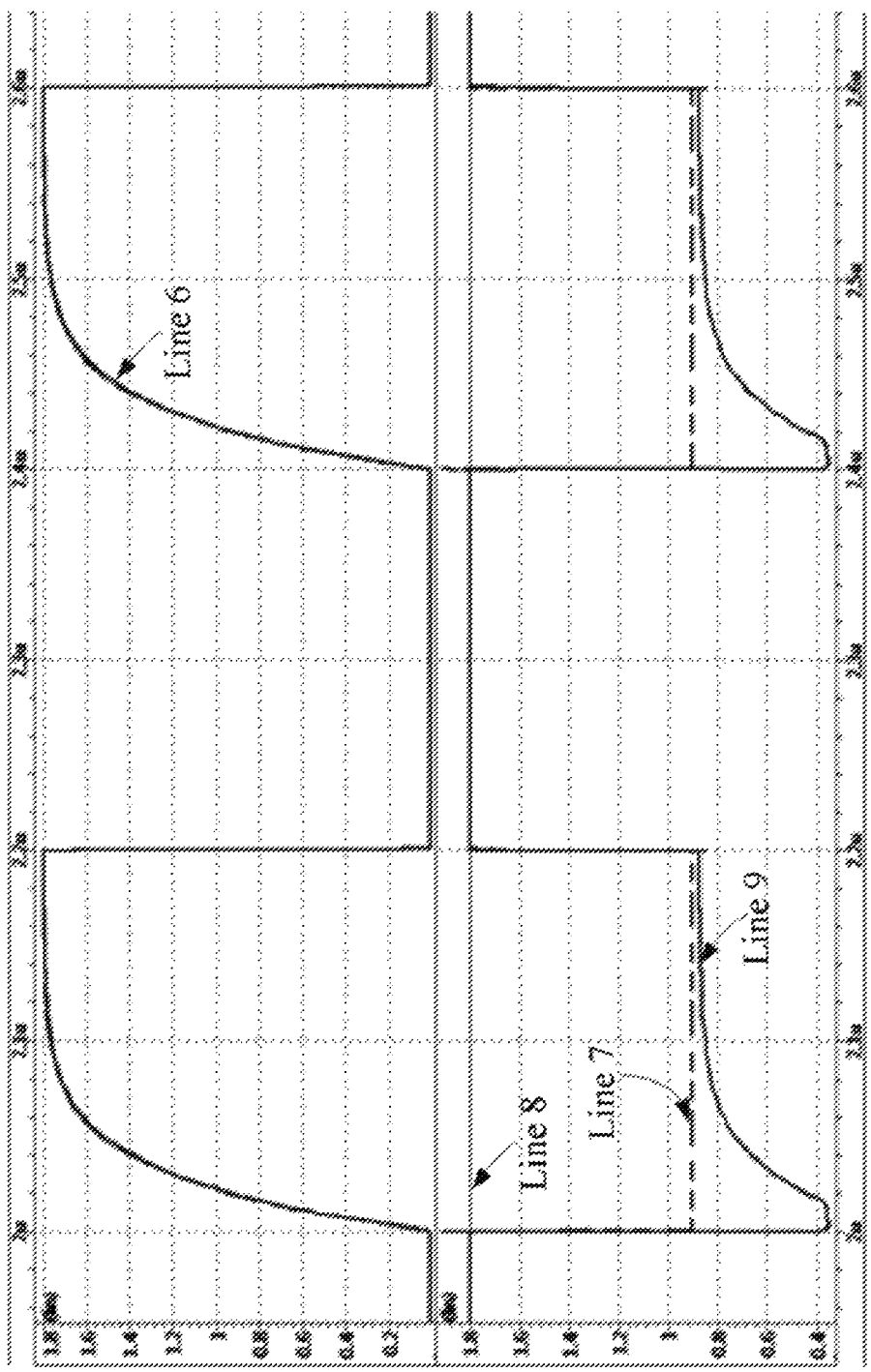

FIG. 9 shows a schematic diagram of simulation results of an IO circuit employing the access control signal generation circuit shown in FIG. 2 and FIG. 3 and the IO circuit in some implementations in an open-drain mode under another simulation condition. The upper graph in FIG. 9 is a simulation waveform for the voltage value $V_{PAD}$ of the IO port PAD, and the lower graph in FIG. 9 is a simulation waveform for the gate voltage of the third PMOS transistor MP3. Line 6 is a simulation waveform for the voltage value $V_{PAD}$ of the IO port PAD of the IO circuit corresponding to FIG. 2 and FIG. 3 and the IO circuit provided in some implementations, line 7 is a simulation waveform for the gate voltage V(gate) of the third PMOS transistor MP3 of the IO circuit diagram corresponding to FIG. 2, line 8 is a simulation waveform for the gate voltage V(gate) of the third PMOS transistor MP3 of the IO circuit corresponding to FIG. 3, and line 9 is a simulation waveform for the gate voltage V(gate) of the third PMOS transistor MP3 of the IO circuit provided in some implementations.

The simulation condition shown in FIG. 9 includes: in the open-drain mode, the voltage value $VDD_{VT}$ of the external power source VDDVT is 1.8 V, the voltage value $VDD_{IO}$ of the IO power source VDDIO is 1.8 V, and the voltage value of the core power source is 0.9 V.

It can be seen from FIG. 9 that although the gate voltage of the third PMOS transistor MP3 in three IO circuits is different, the simulation waveforms for $V_{PAD}$ of the three IO circuits are the same and all show good open-drain performance.

In the simulation condition shown in FIG. 8, the voltage value of the external power source VDDVT is large, and the difference between the voltage value of the external power source VDDVT and the voltage value of the core power source is greater than the maximum value of the working voltage of a device (the third PMOS transistor MP3) (that is, the tolerance voltage of the third PMOS transistor MP3), while in the simulation condition shown in FIG. 9, the voltage value of the external power source VDDVT is the same as the voltage value of the IO power source VDDIO.

It can be seen from the foregoing simulation that the IO circuit in some implementations may apply an external power source with broad voltage value range to the open-drain mode and may also have excellent open-drain performance. In some implementations, when the tolerance voltage of the third PMOS transistor MP3 is 1.98 V, the voltage value of the shown external power source VDDVT may be 1.62 V~3.63 V.

Figure 10:
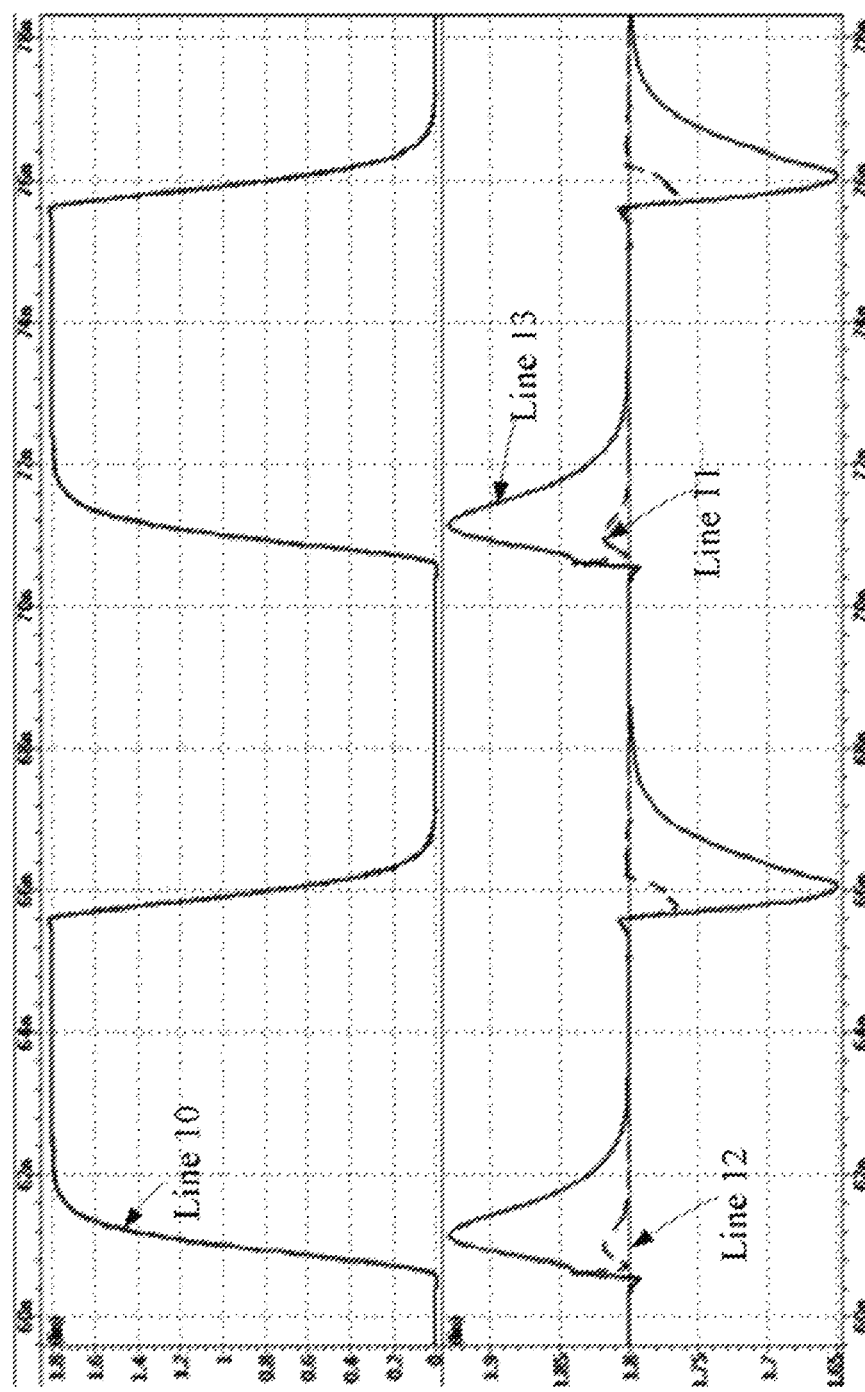
FIG. 10 illustrates a schematic diagram of simulation results of the IO circuit employing the access control signal generation circuit shown in FIG. 2 and FIG. 3 and the IO circuit in forms of the present disclosure in a sending mode.

FIG. 10 shows a schematic diagram of simulation results of an IO circuit employing the access control signal generation circuit shown in FIG. 2 and FIG. 3 and the IO circuit in some implementations in a sending mode. The upper graph in FIG. 10 is a simulation waveform for the voltage value $V_{PAD}$ of the IO port PAD, and the lower graph in FIG. 10 is a simulation waveform for the gate voltage of the third PMOS transistor MP3.

Line 10 is a simulation waveform for the voltage value $V_{PAD}$ of the IO port PAD of the IO circuit corresponding to FIG. 2 and FIG. 3 and the IO circuit provided in some implementations, line 11 is a simulation waveform for the gate voltage V(gate) of the third PMOS transistor MP3 of the IO circuit diagram corresponding to FIG. 2, line 12 is a simulation waveform for the gate voltage V(gate) of the third PMOS transistor MP3 of the IO circuit corresponding to FIG. 3, and line 13 is a simulation waveform for the gate voltage V(gate) of the third PMOS transistor MP3 of the IO circuit provided in some implementations.

The simulation condition shown in FIG. 10 includes: in the sending mode, the voltage value of the IO power source VDDIO is 1.8 V, and the voltage value of the core power source is 0.9 V.

It can be seen from FIG. 10 that the waveforms of $V_{PAD}$ of three IO structures are overlapped and that the difference between the gate-source voltages of the third PMOS transistor MP3 in the three IO structures remain about 1.8 V, which means that the IO circuit provided in some implementations keeps having excellent sending function.

Although the present disclosure is disclosed as above, it is not limited thereto. Various alterations and modifications may be made by a person skilled in the art without departing from the spirit and scope of the present disclosure, and therefore, with regard to the scope of protection of the present disclosure, the scope defined in the claims shall prevail.

What is claimed is:

1. An access control signal generation circuit for an IO circuit, comprising:
    a bias module coupled with an IO port, the bias module configured to generate an access control signal according to an IO port signal and an IO control signal, wherein a first voltage value of the access control signal is equal to a larger value between a second voltage value of an IO port voltage division signal and a voltage value of the IO control signal, and the second voltage value of the IO port voltage division signal is equal to a value of percentage of a third voltage value of the IO port signal, wherein the percentage is greater than 0 and less than 100;
    an access control module coupled with the bias module, the access control module configured to cut off or conduct based on the first voltage value of the access control signal and the third voltage value of the IO port signal received and to output a first interface signal, wherein in an open-drain mode, when the IO control signal is in logic low level, the access control module is conducting and a voltage value of the first interface signal varies according to the third voltage value of the IO port signal; and
    a higher-selection module coupled with an IO power source and the IO port configured to generate a second interface signal according to an IO power source signal and the IO port signal, wherein a voltage value of the second interface signal is equal to a larger value between a voltage value of the IO power source signal and the third voltage value of the IO port signal.

2. The access control signal generation circuit according to claim 1, wherein when the first voltage value of the access control signal is equal to the second voltage value of the IO port voltage division signal, the access control module is conducting.

3. The access control signal generation circuit according to claim 1, wherein the access control module comprises: a third PMOS transistor, wherein the gate electrode of the third PMOS transistor receives the access control signal, the source electrode of the third PMOS transistor receives the IO port signal, and the drain electrode of the third PMOS transistor receives the first interface signal.

4. The access control signal generation circuit according to claim 3, wherein the percentage satisfies the following condition: $1-V_t/V_{pad}$ is less than or equal to the percentage, which is less than or equal to $1-V_{th}/V_{pad}$, wherein $V_b$ is the second voltage value of the IO port voltage division signal, $V_{th}$ is the threshold voltage of the third PMOS transistor, $V_t$ is the tolerance voltage of the third PMOS transistor, and $V_{PAD}$ is the third voltage value of the IO port signal.

5. The access control signal generation circuit according to claim 4, wherein the second voltage value of the IO port voltage division signal is half of the third voltage value of the IO port signal.

6. The access control signal generation circuit according to claim 1, wherein the bias module comprises:
    a voltage division unit configured to generate the IO port voltage division signal according to the voltage dividing of the IO port signal; and
    a higher-selection unit coupled with the voltage division unit, the higher-selection unit configured to output the access control signal according to the IO port voltage division signal and the IO control signal.

7. The access control signal generation circuit according to claim 6, wherein the voltage division unit comprises:
    a first resistance and a second resistance connected in series, wherein one end of the first resistance receives the IO port signal, the other end of the first resistance is coupled with the second resistance and outputs the IO port voltage division signal, and an end, which is not connected to the first resistance, of the second resistance is connected to the ground.

8. The access control signal generation circuit according to claim 7, wherein resistance values of the first resistance and the second resistance are equal.

9. The access control signal generation circuit according to claim 7, wherein the voltage division unit further comprises:
a first capacitance connected in parallel with the first resistance; and
a second capacitance connected in parallel with the second resistance.

10. The access control signal generation circuit according to claim 6, wherein the higher-selection unit comprises:
a sixth PMOS transistor, and
a seventh PMOS transistor,
wherein a source electrode of the sixth PMOS transistor is coupled with a gate electrode of the seventh PMOS transistor and receives the IO control signal,
wherein a gate electrode of the sixth PMOS transistor is coupled with a drain electrode of the seventh PMOS transistor and receives the IO port voltage division signal, and
wherein the drain electrode and a substrate of the sixth PMOS transistor are coupled with a substrate and a source electrode of the seventh PMOS transistor and output the access control signal.

11. The access control signal generation circuit according to claim 1, wherein the higher-selection module comprises:
a first PMOS transistor, and
a second PMOS transistor,
wherein a source electrode of the first PMOS transistor is coupled with a gate electrode of the second PMOS transistor and receives the IO power source signal, a gate electrode of the first PMOS transistor receives the IO port signal, and a drain electrode of the first PMOS transistor is coupled with a substrate and outputs the second interface signal; and
wherein a source electrode of the second PMOS transistor is coupled with a substrate and coupled with the drain electrode of the first PMOS transistor, and a drain electrode of the second PMOS transistor is coupled with the gate electrode of the first PMOS transistor.

12. The access control signal generation circuit according to claim 1, further comprising: a switch module coupled with the access control module, wherein one end of the switch module is connected to the ground, and the other end of the switch module outputs the first interface signal, wherein when the IO control signal is in logic high level, the switch module is enabled, and the first interface signal is in logic low level.

13. The access control signal generation circuit according to claim 12, wherein the switch module comprises:
a first NMOS transistor, and
a second NMOS transistor connected in series with the first NMOS transistor,
wherein:
a gate electrode of the first NMOS transistor is used to receive the IO power source signal,
a drain electrode of the first NMOS transistor outputs the first interface signal,
a gate electrode of the second NMOS transistor receives the IO control signal,
a drain electrode of the second NMOS transistor is coupled with a source electrode of the first NMOS transistor, and a source electrode of the second NMOS transistor, a substrate of the second NMOS transistor, and a substrate of the first NMOS transistor are all connected to the ground.

14. An IO circuit, comprising:
the access control signal generation circuit according to claim 1;
a logic conversion module configured to receive an input Core signal and an input Core control signal and to output the IO control signal and an internal pull-up control signal;
an internal pull-up module coupled with the access control signal generation circuit, the internal pull-up module configured to receive the internal pull-up control signal, the IO power source signal, the IO port signal, the first interface signal, and the second interface signal, and to conduct and pull the IO port up when the input Core signal is in logic high level and being cut off in the open-drain mode; and
an external pull-up resistance connected between an external power source and the IO port in series, wherein the IO port is pulled up through the external pull-up resistance in the open-drain mode.

15. The IO circuit according to claim 14, wherein the internal pull-up module comprises:
a fourth PMOS transistor, and
a fifth PMOS transistor,
wherein a gate electrode of the fourth PMOS transistor receives the internal pull-up control signal, a source electrode of the fourth PMOS transistor is used to receive the IO power source signal, and a drain electrode of the fourth PMOS transistor is coupled with the fifth PMOS transistor; and
wherein a gate electrode of the fifth PMOS transistor receives the first interface signal, a drain electrode of the fifth PMOS transistor is coupled with the IO port, and a substrate of the fifth PMOS transistor and a substrate of the fourth PMOS transistor are coupled with the second interface signal.

16. The IO circuit according to claim 15, wherein:
the logic conversion module is further configured to output an internal pull-down control signal; and
the IO circuit further comprises: an internal pull-down module coupled with the internal pull-up module and is configured to receive the IO power source signal, wherein in a sending mode, the internal pull-down module pulls the IO port down based on the internal pull-down control signal.

17. The IO circuit according to claim 16, wherein the internal pull-down module comprises:
a fourth NMOS transistor, and
a fifth NMOS transistor connected in series,
wherein a drain electrode of the fourth NMOS transistor is connected to the IO port, a drain electrode of the fourth NMOS transistor is used to receive the IO power source signal, and a source electrode of the fourth NMOS transistor is coupled with the fifth NMOS transistor; and
wherein a gate electrode of the fifth NMOS transistor is used to receive the internal pull-down control signal, and a drain electrode, a substrate and a source electrode of the fifth NMOS transistor are coupled with a substrate of the fourth NMOS transistor and connected to the ground.

18. The IO circuit according to claim 14, wherein the IO circuit further comprises: an external load capacitance coupled with the external pull-up resistance, wherein one end of the external load capacitance is connected to the IO port, and the other end of the external load capacitance is connected to the ground.

19. The IO circuit according to claim 14, wherein the logic conversion module comprises: an internal level conversion unit coupled with the access control signal generation circuit, wherein the internal level inversion unit is configured to output the IO control signal based on the input Core control signal, and the IO control signal and the input Core control signal are in opposite logic.

20. The IO circuit according to claim 16, wherein when the input Core control signal is in logic high level, the internal pull-up control signal is in logic high level, and the internal pull-down control signal is in logic low level.

* * * * *